United States Patent [19]

Min

[11] Patent Number: 5,735,026

[45] Date of Patent: Apr. 7, 1998

[54] METHOD FOR THE MANUFACTURE OF AN ELECTRODISPLACIVE ACTUATOR ARRAY

[75] Inventor: Yong-Ki Min, Seoul, Rep. of Korea

[73] Assignee: Daewoo Electronics Co., Ltd., Seoul, Rep. of Korea

[21] Appl. No.: 278,472

[22] Filed: Jul. 20, 1994

[30] Foreign Application Priority Data

Jul. 21, 1993 [KR] Rep. of Korea ..................... 9313843

[51] Int. Cl.⁶ .............................. G02B 26/00; H01L 41/22
[52] U.S. Cl. ......................... 29/25.35; 359/224; 359/291; 359/850
[58] Field of Search ............................ 29/25.35, 831, 29/832; 359/224, 259, 291, 295, 850, 851; 353/38, 99; 310/328

[56] References Cited

U.S. PATENT DOCUMENTS

| | | | |
|---|---|---|---|
| 5,159,225 | 10/1992 | Um | 310/328 |
| 5,469,302 | 11/1995 | Lim | 359/224 X |
| 5,506,720 | 4/1996 | Yoon | 359/224 |
| 5,543,959 | 8/1996 | Jeon | 29/25.35 X |
| 5,550,680 | 8/1996 | Yoon | 359/850 |
| 5,552,923 | 9/1996 | Min | 29/25.35 X |

*Primary Examiner*—S. Thomas Hughes
*Attorney, Agent, or Firm*—Anderson, Kill & Olick, P.C.

[57] ABSTRACT

The inventive method for the manufacturing an array of M×N electrodisplacive actuated mirrors comprises a step of: preparing a ceramic wafer, made of an electrodisplacive material, having a top and bottom surface; forming an array of M×N first electrodes and an array of M+1 second electrodes on the bottom and top surface of ceramic wafer, respectively; mounting the ceramic wafer on top of an active matrix; covering each of the M+1 second electrodes with an insulating layer; forming a set of M trenches; placing an array of M×N hinges on the top surface of the ceramic wafer; and forming a mirror on the top surface of each of the M×N hinges to thereby form an array of M×N electrodisplacive actuated mirrors.

8 Claims, 9 Drawing Sheets

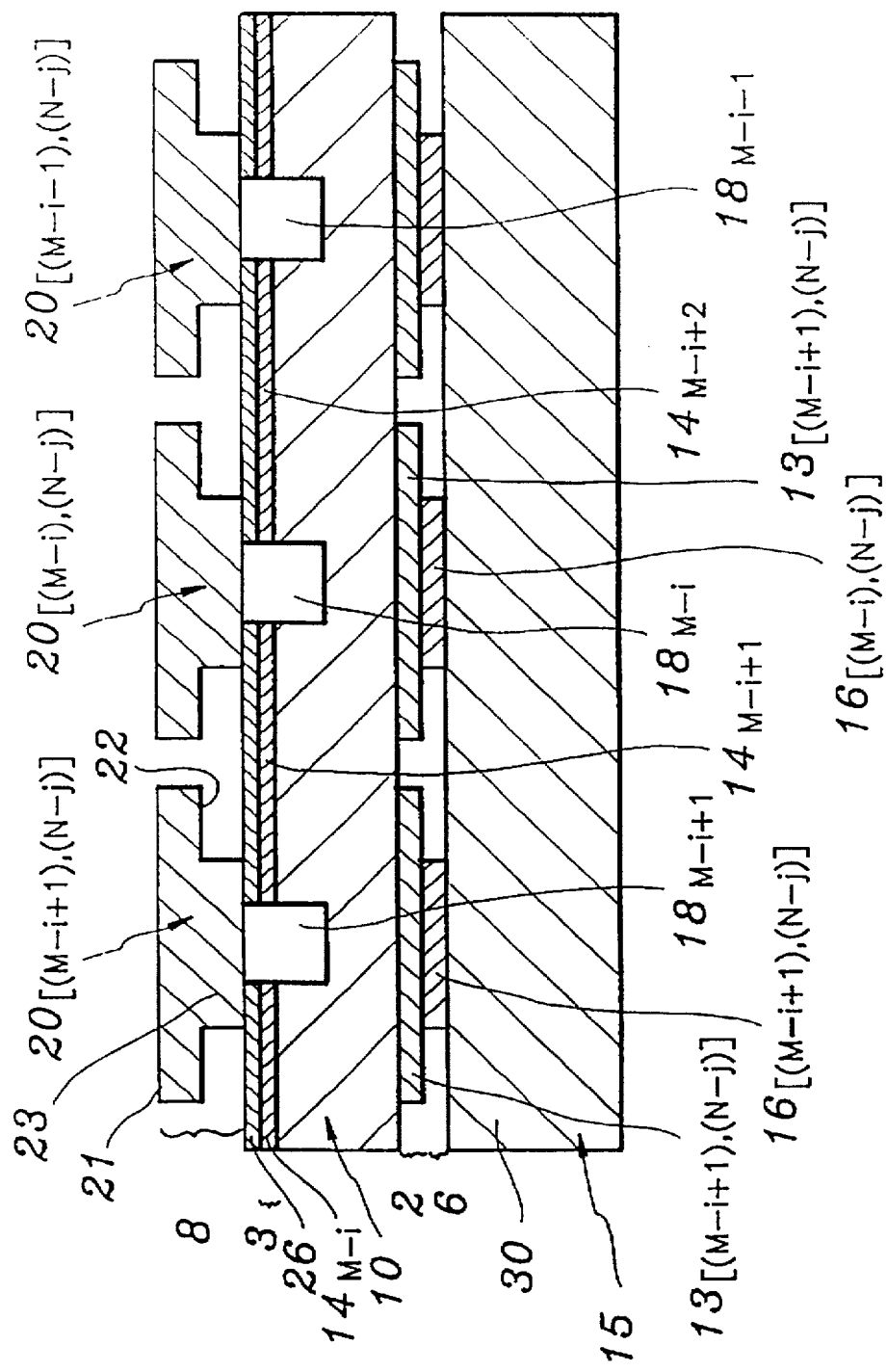

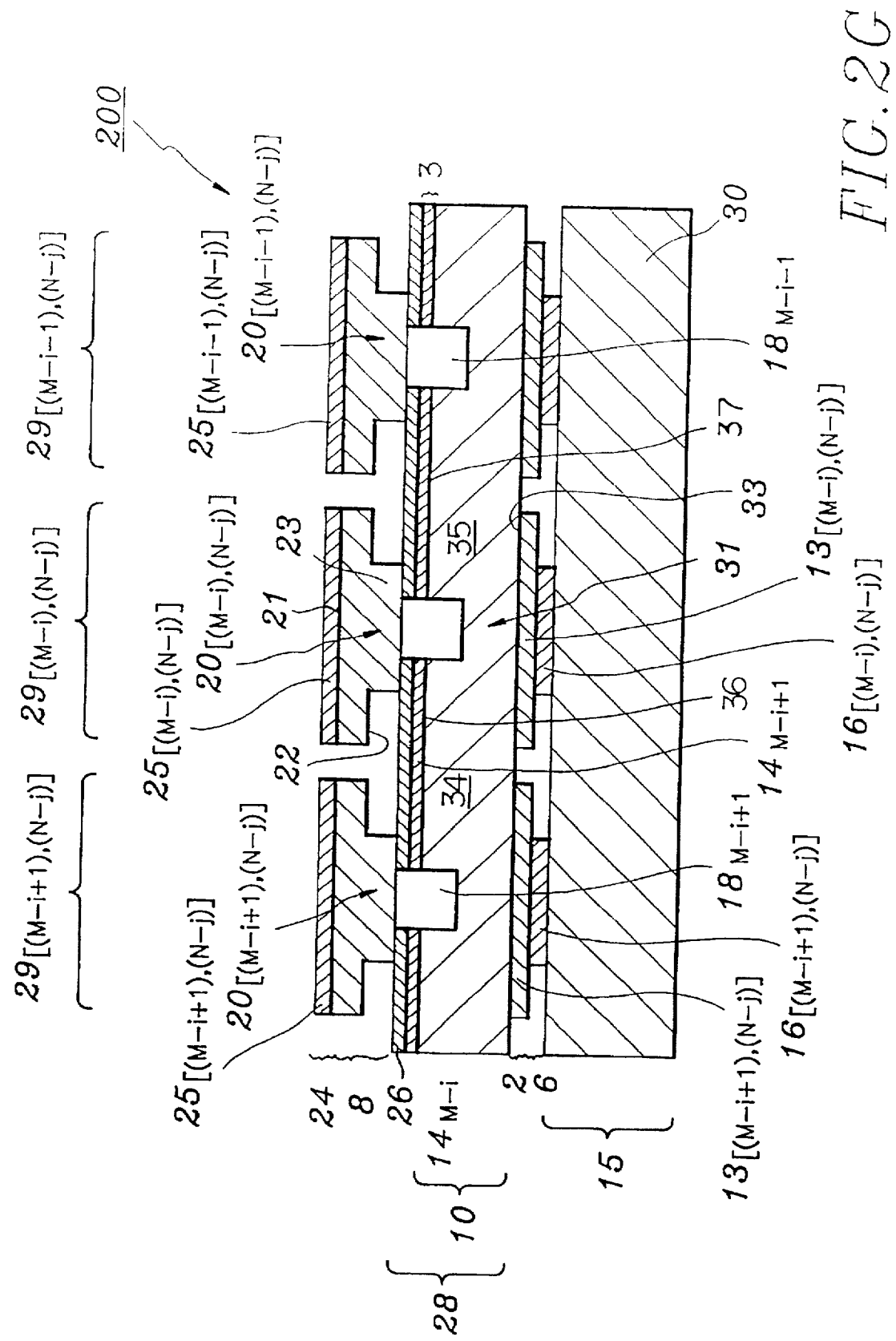

METHOD FOR THE MANUFACTURE OF AN ELECTRODISPLACIVE ACTUATOR ARRAY

FIELD OF THE INVENTION

The present invention relates to an optical projection system; and, more particularly to an array of electrodisplacive actuated mirrors and an improved method for manufacturing same for use therein.

BACKGROUND OF THE INVENTION

Among the various video display systems available in the art, an optical projection system is known to be capable of providing a high quality video display in a large scale. In such an optical projection system, light from a lamp is uniformly illuminated onto an array of, e.g., M×N, actuated mirrors such that each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture. By applying an electrical signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In FIG. 1, there is shown a cross sectional view of an array of M×N actuated mirrors 100 disclosed in a copending, commonly owned application, U.S. Ser. No. 08/246,891, entitled "PIEZOELECTRIC ACTUATOR ARRAY AND METHOD FOR THE MANUFACTURE THEREOF", wherein M and N are integers, comprising an active matrix 1, an array 4 of M×N actuators, e.g., 40, 40', 40", a corresponding array 7 of M×N mirrors, e.g., 70, 70', 70" and a corresponding array 9 of M×N connecting terminals, e.g., 90, 90', 90". Each of the actuators, e.g., 40, in turn, is provided with a top surface 46, a bottom surface 47, and a pair of external sides 48a, 48b; and has a bimorph structure, comprising a pair of electrodisplacive members 42a, 42b, a common signal electrode 43 located between the pair of electrodisplacive members 42a, 42b and a pair of reference electrodes 44a, 44b on the pair of external sides 48a, 48b of the actuator 40, respectively (as all of the actuators, e.g., 40, 40', 40", are essentially identical, the following description will be given with respect to a representative actuator 40).

The electrodisplacive members 42a, 42b are comprised of an electrodisplacive material such as a piezoelectric material, e.g., lead zirconium titanate (PZT), or an electrostrictive materiait e.g., lead magnesium niobate-lead titanate (PMN-PT).

The bottom surface 47 of the actuator 40 is mounted on the active matrix 1; and a mirror 70 is mounted on the top surface 46 of the actuator 40. Further, a connecting terminal 90 is used for electrically connecting the common signal electrode 43 in the actuator 40 to the active matrix 1.

When a voltage is applied between the common signal electrode 43 and the reference electrodes 44a, 44b, the electrodisplacive material located therebetween will deform in a direction determined by the polarity of the voltage.

In a copending, connmonly owned application, U.S. Ser. No. 08/216,754, now U.S. Pat. No. 5,543,959 entitled "ACTUATOR ARRAY AND METHOD FOR THE MANUFACTURE THEREOF", there is disclosed a method for manufacturing such an array of M×N electrodisplacive actuators for use in the above-described optical projection system, the method comprising the steps of:

(1) forming a multilayered ceramic structure having M layers of a first conductive metallization and M+1 layers of an electrodisplacive material wherein each layer of the first conductive metallization is placed between two layers of the electrodisplacive material;

(2) obtaining a composite ceramic wafer by slicing the multilayered ceramic structure in a direction normal to the layers of the first conductive metallization;

(3) providing a plurality of regularly spaced horizontally directional trenches running parallel to each other using mechanical means, e. g., sawing, wherein each of the trenches is located at an equidistance from two adjacent layers of the first conductive metallization;

(4) depositing a second conductive metallization; and (5) preparing N−1 regularly spaced vertically directional cuts on the composite ceramic wafer prepared using steps(3) and (4) to thereby obtain the array of M×N electrodisplacive actuators.

The first and the second conductive metallizations serve as the common signal electrode, e.g., 43, and the reference electrodes, e.g., 44a, 44b, in the completed actuated mirror array, respectively.

There is also disclosed, in another copending, commonly assigned application, U.S. Ser. No. 08/216,755, entitled "MIRROR ARRAY AND METHOD FOR THE MANUFACTURE THEREOF", a method for attaching an array of M×N mirrors to an array of M×N electrodisplacive actuators, the method comprising the steps of:

(1) forming a separation layer on a substrate;

(2) depositing a mirror layer on the separation layer;

(3) defining the mirror layer into an array of M×N mirrors;

(4) providing a supporting layer on the substrate treated in accordance with said steps (a) to (c) above;

(5) bonding the actuator array onto the supporting layer such that each of the M×N electrodisplacive actuators is aligned with each of the M×N mirrors defined in step (3);

(6) removing the separation layer, thereby to disengage the substrate from the supporting layer and the mirrors; and (7) patterning the supporting layer into an array of M×N disjointed supporting members, each of the members being commensurate with each of the M×N mirrors, thereby providing an array of M×N actuated mirrors.

There is a number of problems associated with the above-described methods for manufacturing an array of M×N electrodisplacive actuators and for attaching an array of M×N mirrors thereto, however. First of all, the first conductive metallization, which will serve as the common signal electrode 43 in the completed actuated mirror array, may be deformed or bend during the sintering process involved in the preparation of the multilayered ceramic structure, which may, in turn, make it difficult to form dimensionally correct trenches and, hence, the actuators. Another problem present in the above method is that, for the first conductive metallization, it requires expensive electrode materials having high melting points such as platinum (Pt) or palladium (Pd) so as for the first conductive metallization to withstand an extremely high sintering temperature, e.g., 1,250° C. or higher. Further, in the case of manufacturing an array of M×N piezoelectric actuated mirrors, the multilayered ceramic structure must be poled prior to undergoing the steps described above by holding it under a high DC voltage, which will often lead either to an electrical breakdown or an electrical degradation thereof. In addition, since the array of M×N electrodisplacive actuators is manufactured using mechanical means, e.g., sawing, it may be difficult to obtain the desired reproducibility, reliability and yield in the manufacturing of the M×N electrodisplacive actuated mirrors; and, furthermore, there may be a limit to the down sizing thereof.

Moreover, in practicing the above method of attaching an array of M×N mirrors to an array of M×N electrodisplacive actuators, it may be difficult not only to align each of the M×N electrodisplacive actuators with each of the M×N mirrors, but to remove the separation layer or disengage the substrate from the supporting layer and the mirrors.

SUMMARY OF THE INVENTION

It is, therefore, a primary object of the present invention to provide a method for manufacturing an array of M×N electrodisplacive actuated mirrors, wherein M and N are integers, which dispenses with the use of a multilayered electrodisplacive ceramic structure.

It is another object of the present invention to provide an improved method for manufacturing in a high yield an array of M×N electrodisplacive actuated mirrors of a higher reproducibility and reliability.

It is a further object of the present invention to provide a method for manufacturing an array of M×N piezoelectric actuated mirrors which does not require an extremely high DC voltage during the poling process thereof.

It is still another object of the present invention to provide a method for manufacturing an array of M×N electrodisplacive actuated mirrors, wherein each of the M×N mirrors and each of the M×N electrodisplacive actuators are easily aligned.

In accordance with one aspect of the present invention, there is provided an improved method for manufacturing an array of M×N electrodisplacive actuated mirrors, wherein M and N are integers, comprising the steps of:

(a) preparing a ceramic wafer, made of an electrodisplacive material, having a top and a bottom surfaces;

(b) forming an array of M×N regularly spaced, identically sized first electrodes on the bottom surface of said ceramic wafer and an array of M+1 regularly spaced, identically sized second electrodes on the top surface thereof, wherein each of the M+1 second electrodes extends across the top surface and each of the M×N first electrodes overlaps portions of two adjacent second electrodes and the centerline between two adjacent second electrodes coincides with the centerline of the first electrodes overlapping thereof;

(c) mounting said ceramic wafer treated in accordance with said step (b) on an active matrix, including a substrate, an array of M×N transistors and an array of M×N connecting terminals to thereby connect each of the first electrodes with each of the M×N connecting terminals;

(d) covering each of the M+1 second electrodes with an insulating layer;

(e) providing a photoresistive necked segment on top of each of the M+1 insulating layers covering the M+1 second electrodes;

(f) forming a set of M trenches, wherein each of the M trenches is located between two second electrodes and on the centerline of the first electrodes, runs parallel to the second electrodes and is provided with a set of N−1 grooves, running perpendicular thereto;

(g) removing the photoresistive necked segments;

(h) placing an array of M×N hinges on the top surface of said ceramic wafer treated in accordance with said steps (b), (c), (d), (e), (f) and (g), wherein each of the M×N hinges is provided with a top surface and a bottom surface provided with a protrusion mounted simultaneously on the insulating layers covering two adjacent second electrodes;

(i) providing a wafer soluble separator on the exposed region on the top surface of said ceramic wafer treated in accordance with said steps (b) to (h), not covered by the M×N hinges;

(j) forming a mirror on the top surface of each of the M×N hinges;

(k) removing the water soluble separator; and (l) making appropriate electrical connections to thereby form an array of M×N electrodisplacive actuated mirrors.

In accordance with another aspect of the present invention, there is provided an array of M×N electrodisplacive actuated mirrors having a novel structure for use in an optical projection system, comprising:

an active matrix including a substrate, an array of M×N transistors and an array of M×N connecting terminals thereon;

an array of M×N electrodisplacive actuators, wherein each of the M×N electrodisplacive actuators includes an electrodisplacive member having a top and a bottom surfaces, a first electrode, a pair of second electrodes, and a pair of insulating layers, the top surface of the electrodisplacive member being evenly separated by a trench formed thereon and running across the top surface, thereby creating a first actuating member having a first top surface and a second actuating member having a second top surface, the first electrode being located on the bottom surface thereof, each of the pair of second electrodes being located on the first top surface and the second top surface, respectively, and each of the pair of insulating layers being located on top of each of the pair of second electrodes;

an array of M×N hinges, wherein each of the M×N hinges is provided with a flat top surface and a bottom surface having a protrusion mounted on the top of each of the M×N electrodisplacive actuators;

an array of M×N connecting terminals, wherein each of the connecting terminals is used for electrically connecting each of the first electrodes with the active matrix; and an array of M×N mirrors, wherein each of the M×N mirrors is mounted on the top surface of each of the M×N hinges.

BRIEF DESCRIPTION OF THE DRAWINGS

The above and other objects and features of the present invention will become apparent from the following description of preferred embodiments given in conjunction with the accompanying drawings, wherein:

FIGS. 2A to 2G illustrate the steps used in constructing an inventive array of M×N electrodisplacive actuated mirrors.

DETAILED DESCRIPTION OF THE PREFERRED EMBODIMENT

Figure 1:
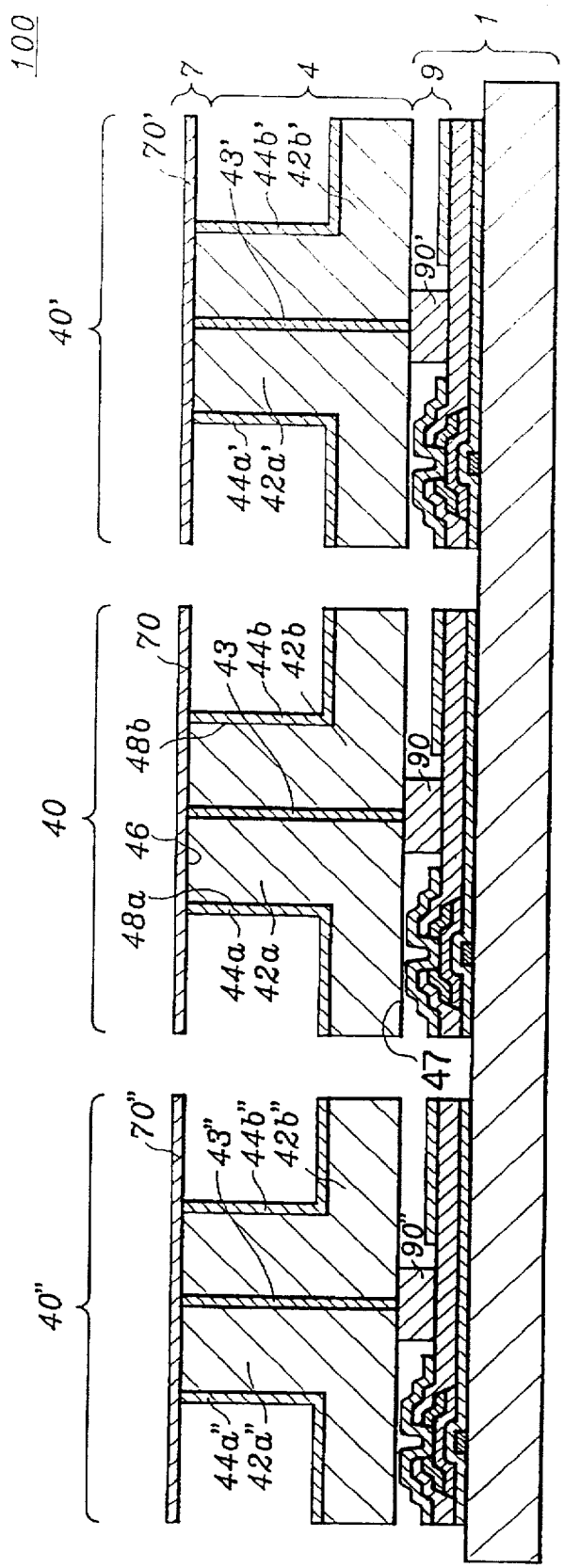
FIG. 1 shows a cross sectional view of a prior art array of M×N electrodisplacive actuated mirrors.
Figure 2A:
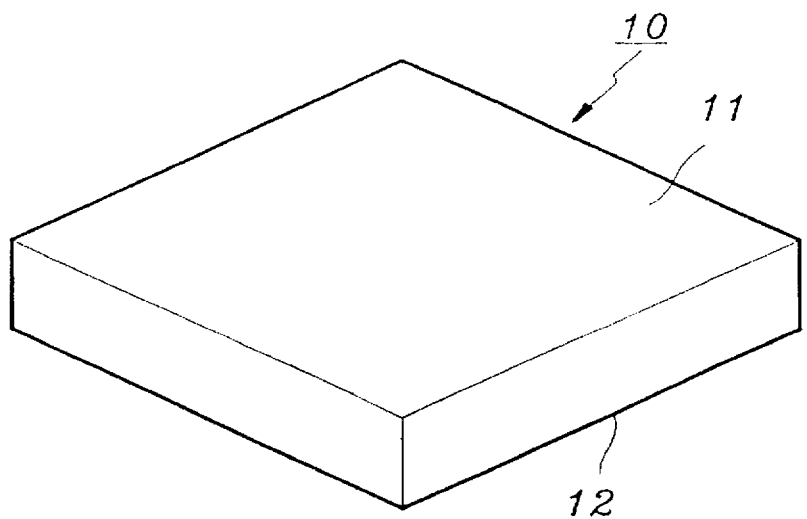

In accordance with the present invention, the process for manufacturing the inventive array of M×N electrodisplacive actuated mirrors, wherein M and N are integers, begins with the preparation of a ceramic wafer 10, as shown in FIG. 2A, made of an electrodisplacive material such as a piezoelectric material, e.g., lead zirconium titanate(PZT) or an electrostrictive material, e.g., lead magnesium niobate-lead titanate (PMN-PT) and having a top and a bottom surfaces, 11, 12, wherein the top and the bottom surfaces, 11, 12, are flat and parallel to each other.

Figure 2B:
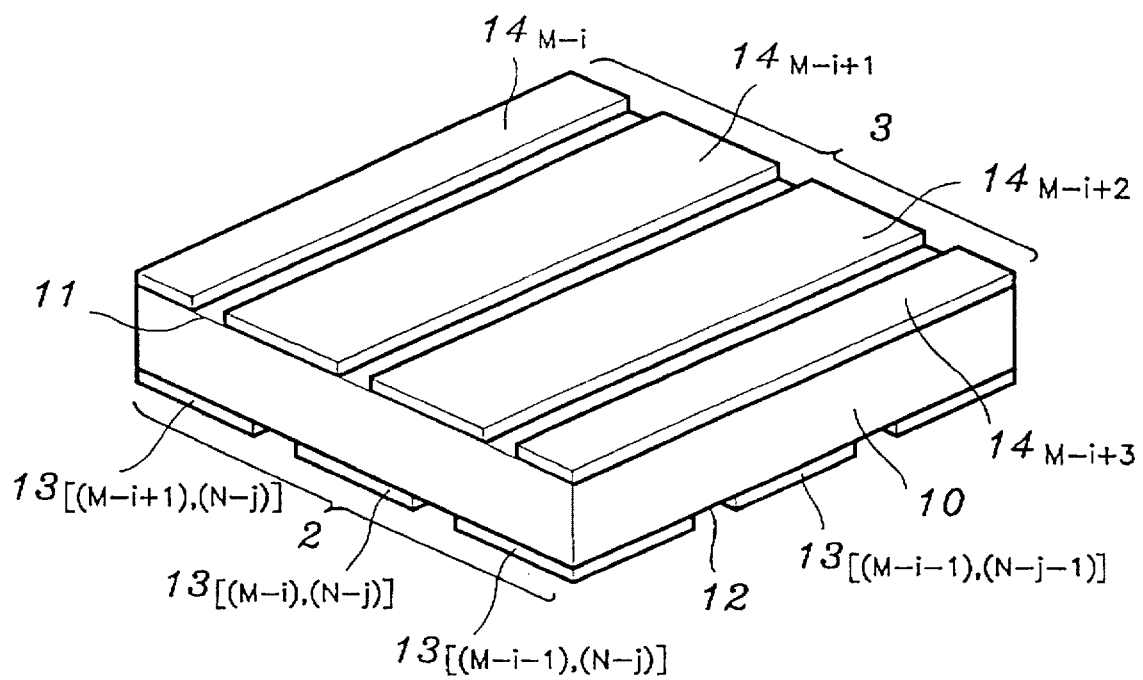

As shown in FIG. 2B, on the bottom surface 12 of the ceramic wafer 10, there is formed an array 2 of M×N regularly spaced, identically sized first electrodes, e.g., 11 thereof, an array 3 of M+1 regularly spaced, identically sized second electrodes, e.g., $14_{M-i}$, $14_{M-i+1}$, $14_{M-i+2}$, wherein i and j are integers, and i and j are less than or equal to M-1 and N-1, respectively. Each of the M+1 second electrodes, e.g., $14_{M-j}$, extends across the top surface 11 of the ceramic wafer 10, runs parallel to each other, and each of the M×N first electrodes, e.g., $13_{[(M-i),(N-j)]}$ is placed in such a way that it overlaps portions of two adjacent second electrodes, e.g., $14_{M-i+1}$, $14_{M-i+2}$ and the centerline between two adjacent second electrodes, e.g., $14_{M-i+1}$, $14_{M-i+2}$ coincides with the centerline thereof.

The array 2 of M×N first electrodes, e.g., $13_{[(M-i), (N-j)]}$ and the array 3 of M+1 second electrodes, e.g., $14_{M-i+1}$ are obtained by covering the entire top and bottom surfaces 11, 12 with a conductive metallization, e.g., Al, Cu or Ni, using, e.g., a sputtering method, and then patterning the top and bottom surfaces 12, 11 into the array 2 of M+1 second electrodes and the array 3 of M×N first electrodes, respectively, by using a photolithography method.

Figure 2C:
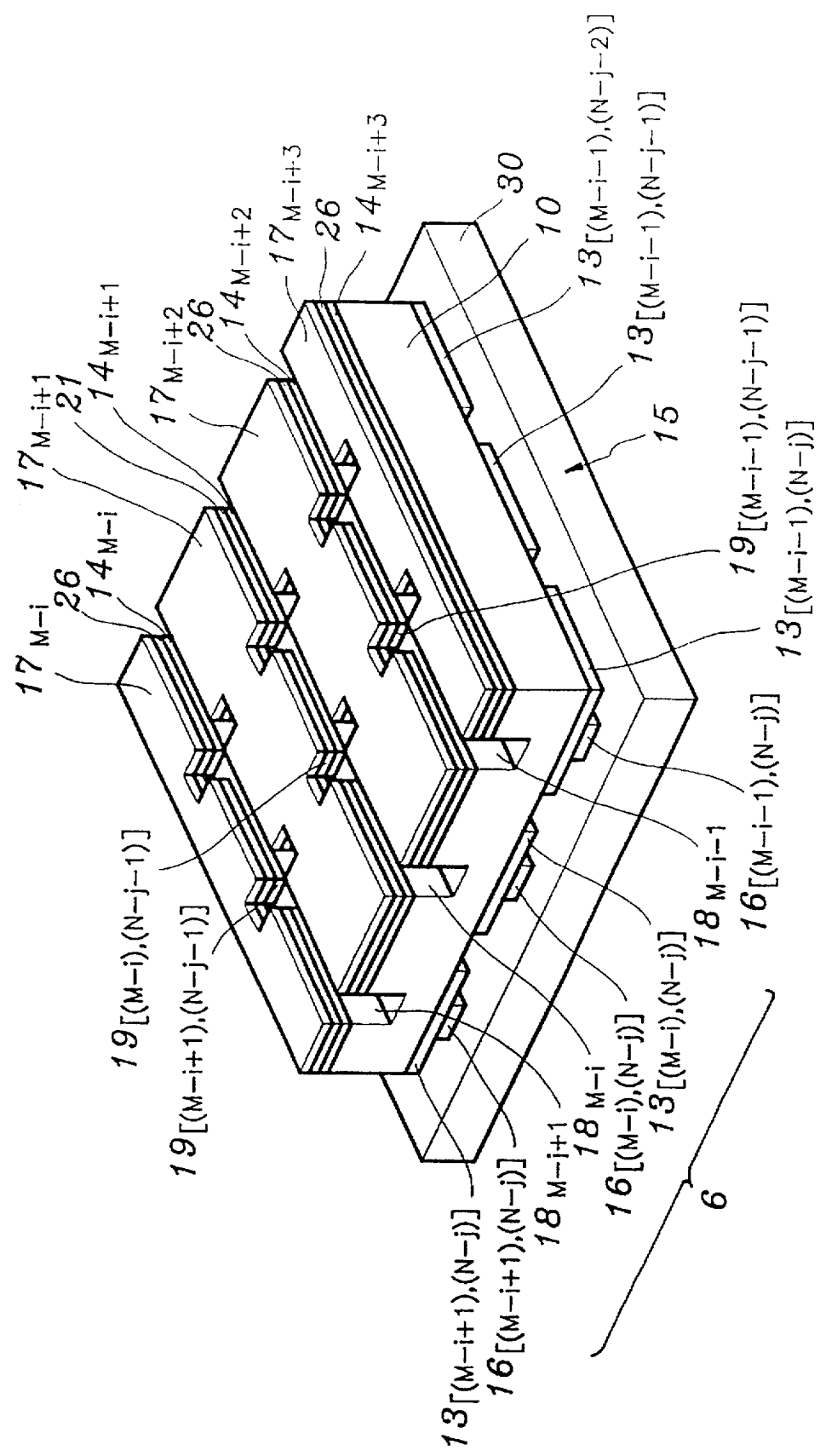

Thereafter, the ceramic wafer 10 treated in accordance with the above-described steps is mounted, as shown in FIG. 2C, on an active matrix 15, including a substrate 30, made of an insulating material, e.g., $Al_2O_3$, or glass, or a semiconductor, e.g., Si, an array of M×N transistors (not shown) and an array 6 of M×N connecting terminals, e.g., $16_{[(M-i+1),(N-j)]}$, $16_{[(M-i), (N-j)]}$, $16_{[(M-i-1),(N-j)]}$ thereon. Each of the M×N connecting terminals, e.g., $16_{[(M-i), (N-j)]}$, is electrically connected with each of the M×N first electrodes, e.g., $13_{[(M-i), (N-j)]}$, using a conductive adhesive.

If the ceramic wafer 10 is made of a piezoelectric material, e.g., PZT, it must be polarized prior to the mounting on the active matrix 15, and this is carried out in two stages: a first stage involving the application of a D.C. voltage between every other second electrodes, e.g., $14_{M-i}$, $14_{M-i+2}$ and the first electrodes, e.g., $13_{[(M-i+1), (N-j)]}$, $13_{[(M-i), (N-j)]}$, $13_{[(M-i-1), (N-j)]}$, wherein the first electrodes are connected to ground (not shown); and a second stage involving the application of the same D.C. voltage between the remaining second electrodes, e.g., $14_{M-i+1}$, $14_{M-i+3}$, and the first electrodes, e.g., $13_{[(M-i+1), (N-j)]}$, $13_{[(M-i), (N-j)]}$, $13_{[(M-i-1), (N-j)]}$, wherein, in contrast with the first stage, the second electrodes are connected to ground (not shown), thereby polarizing the piezoelectric material located therebetween in an opposite direction to the polarization direction of the first stage.

If the ceramic wafer 10 is made of an electrostrictive material, the above described poling process can be omitted.

Subsequently, each of the M+1 second electrodes, e.g., $14_{H-i+1}$, is covered with an insulating layer 26, made of either an oxide or a nitride.

Thereafter, the M+1 second electrodes covered with the insulating layer 26 are covered with M+1 photoresistive necked segments, e.g., $17_{M-i}$, $17_{M-i+1}$, $17_{M-i+2}$, to be used as an etching mask as shown in FIG. 2C.

In the subsequent step the areas not covered by the M+1 photoresistive necked segments are removed using an etching method, thereby forming a set of M regularly spaced, identically sized trenches as shown in FIG. 2C, e.g., $18_{M-i}$, $18_{M-i-}$, $18_{M-i+1}$, running parallel to the M+1 common reference electrodes, wherein the centerline of each trench, e.g., $18_{M-i}$, is aligned with the centerline of the corresponding first electrode, e.g., $13_{[(M-i), (N-j)]}$, and each trench, e.g., $18_{M-i}$, is provided with a set of N-1 equally spaced, identically sized grooves, e.g., $19_{[(M-i), (N-j-1)]}$, $19_{[(M-i), (N-j)]}$, $19_{[(M-i), (N-j+1)]}$, of a fixed length, running perpendicular thereto.

The N-1 grooves are identically placed in all of the M trenches and none of the N-1 grooves in each of the M trenches comes into contact with the grooves in the adjacent trenches. The width and the depth of the M trenches and the M×(N-1) grooves formed are within a range from 5 to 15 μm and from 10 to 20 μm, respectively. Once the M trenches and the M×(N-1) grooves are formed, the photoresistive necked segments, e.g., $17_{M-i}$, $17_{M-i+1}$, $17_{M-i+2}$, are removed.

Figure 2D:
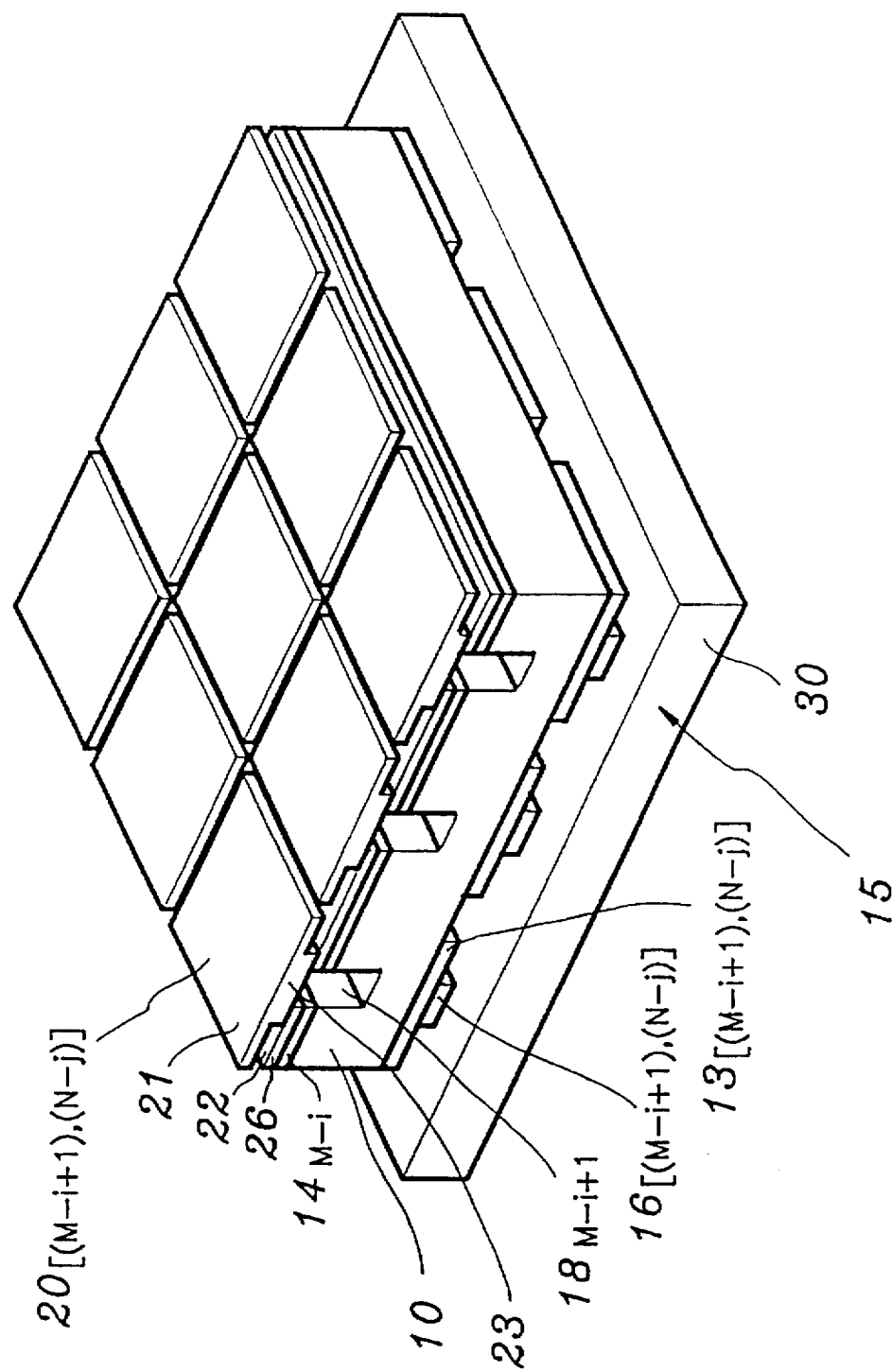

In FIGS. 2D and 2E, there is shown an array 8 of M×N hinges, e.g., $20_{[(M-i+1), (N-j)]}$, $20_{[(M-i),(N-j)]}$, $20_{[(M-i-1), (N-j)]}$, mounted on top of the ceramic wafer 10 treated in accordance with the above-described steps, wherein each of the M×N hinges, e.g., $20_{[(M-i+1), (N-j)]}$, is provided with a flat top surface 21 and a bottom surface 22 with a protrusion 23 such that the bottom of the protrusion 23 can be mounted on the insulating layers 26 covering the corresponding two adjacent second electrodes, e.g., $14_{M-i}$, $14_{M-i+1}$. The hinges are made of an insulating epoxy which solidifies when exposed to an UV light. FIGS. 2D and 2E illustrate a three dimensional and a cross sectional view, respectively, of the ceramic wafer 10 treated in accordance with the above-described steps.

Figure 2F:
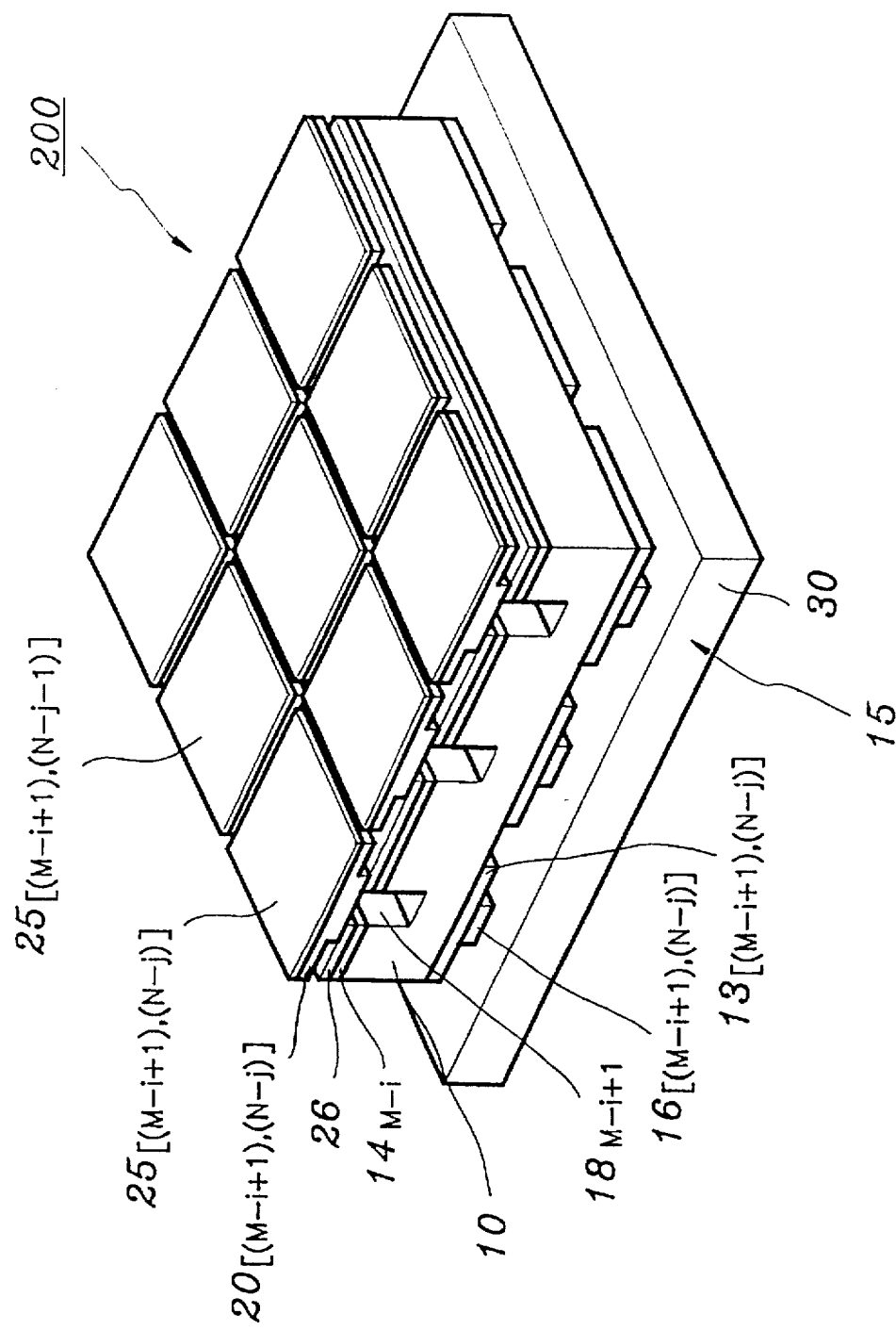

Thereafter, an array 24 of M×N mirrors, e.g., $25_{[(N-i+1), (N-j)]}$, $25_{[<M-j), (N-j)]}$, $25_{[(M-i-1), (N-j)]}$, made of a light reflecting material, e.g., Al, are formed on the top surface 21 of the M×N hinges using such a conventional technique as sputtering method. Furthermore, in order to prevent irregular reflections of the light from the light reflecting surface that might be formed during the sputtering on the areas of the hinges other than the top surface 21, a water soluble separator (not shown) is provided on the exposed region, i.e., the region not covered by the M×N hinges, prior to the sputtering. The separator will be removed afterward. In the subsequent step, appropriate electrical connections are made, thereby forming an array of M×N electrodisplacive actuated mirrors 200 as shown in FIGS. 2F and 2G, wherein FIGS. 2F and 2G depict a three dimensional and a cross sectional views thereof.

The inventive M×N electrodisplacive actuated mirror array 200 comprises: an active matrix 15 including a substrate 30, an array of M×N transistors (not shown) and an array 6 of M×N connecting terminals, e.g., $16_{[(M-i), (N-j)]}$, $16_{[(M-i+1),(N-j)]}$, $16_{[(M-i), (N-j)]}$, $16_{[(M-i+1), (N-j)]}$, $16_{[(M-i-1), (N-j)]}$; an array 28 of M×N electro-displacive actuators, e.g., $29_{[(M-i+1), (N-j)]}$, $29_{[(M-i), (N-j)]}$, $29_{[(M-i-1), (N-j)]}$, wherein each of the actuators, e.g., $29_{[(M-i), (N-j)]}$, includes an electrodisplacive member 31 having a top and a bottom surfaces 32, 33, a first electrode $16_{[(M-i), (N-j)]}$, a pair of second electrodes, $14_{M-i+1}$, $14_{M-i+2}$, and a pair of insulating layers 26 the top surface 32 of the electrodisplacive member 31 being evenly separated by a trench $18_{M-i}$ formed thereon and extending across the top surface, thereby creating a first actuating member 34 having a first top surface 36 and a second actuating member 35 having a second top surface 37, the first electrode $16_{[(M-i), (N-j)]}$ being located on the bottom surface 33 thereof, each of the pair of second electrodes $14_{M-i+1}$, $14_{M-i+2}$ being located on the first top surface 36 and the second top surface 37, respectively, and each of the pair of insulating layers 26 being located on top of each of the pair of second electrodes $14_{M-i+1}$, $14_{M-i+2}$; an array 8 of M×N hinges, e.g., $20_{[(M-i+1), (N-j)]}$, $20_{[(M-i), (N-j)]}$, wherein each of the M×N hinges, e.g., $20_{[(M-i), (N-j)]}$, is provided with a flat top surface 21 and a bottom surface 22 having a protrusion 23 mounted on top of each of the M×N electrodisplacive actuators, e.g., $29_{[(M-i), (N-j)]}$; and an array 24 of mirrors, e.g., $25_{[(M-i+1), (N-j)]}$, $25_{[(M-i), (N-j)]}$, $25_{[(M-i-1), (N-j)]}$, wherein each of the M×N mirrors, e.g. $25_{[(M-i), (N-j)]}$ is mounted on the top surface 21 of each of the M×N hinges, e.g., $20_{[(M-i), (N-j)]}$.

In this embodiment, an addressable driver (not shown) mounted on the bottom surface of the active matrix 15 may be employed to apply a voltage to each of the M×N first electrode in each of the M×N actuators for a desired tilting of the mirror. The voltage may be developed in accordance with the corresponding pixel intensity in an optical projection system.

Figure 3A:
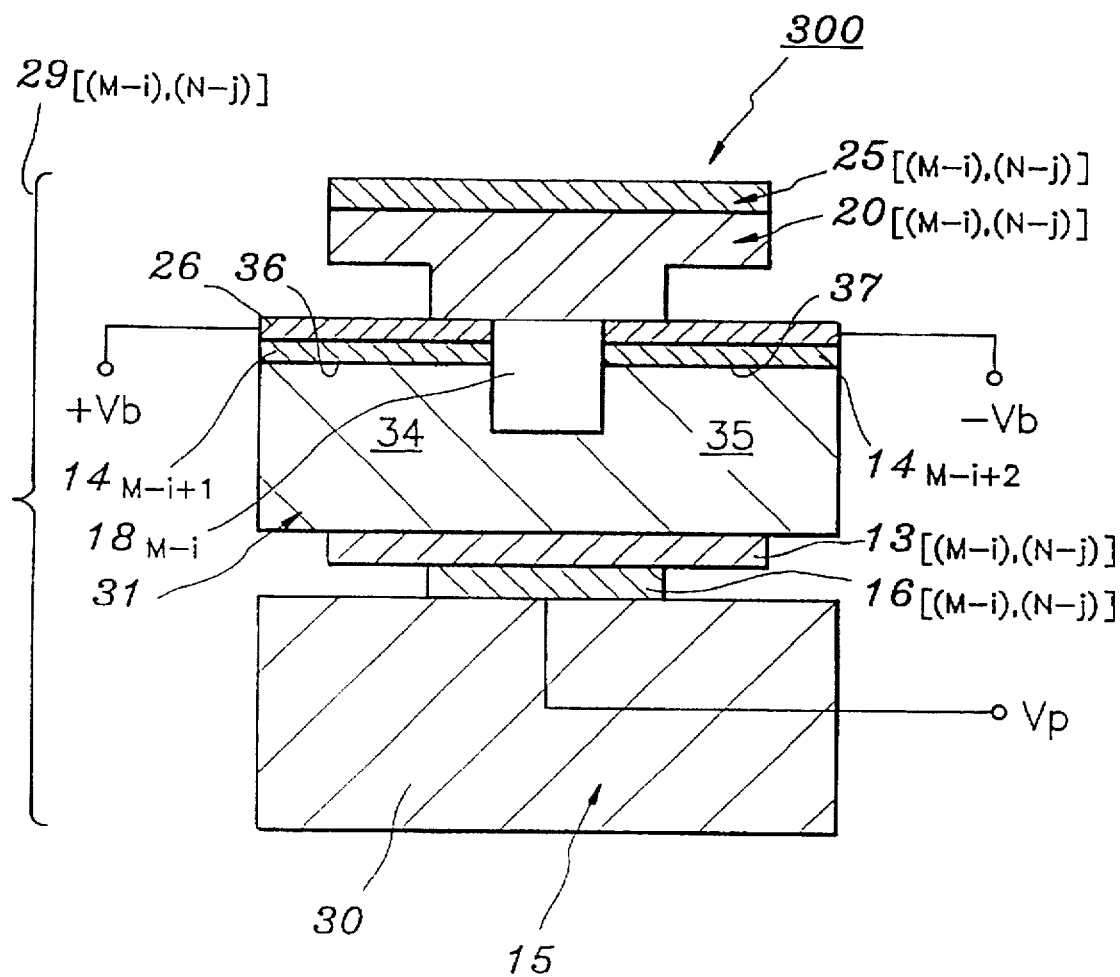
FIGS. 3A and 3B depict cross sectional views of the inventive M×N piezoelectric and electrostrictive actuated mirror arrays, respectively.

If the electrodisplacive member 31 is made of an electrostrictive material, e.g., PMN, the pair of second electrodes in each actuator function as the bias electrodes, the voltage $V_b$ applied thereto having the same magnitude but the opposite polarity, and the first electrode functions as the common signal electrode, the voltage, $V_p$, applied thereto being developed in accordance with a corresponding pixel intensity. In such an actuator, the amount of mechanical deformation the actuator will undergo, and, hence the degree of mirror tilting, is proportional to the difference between the bias voltages, $+V_b$, $-V_6$, applied to the pair of second electrodes and the signal voltage, $V_p$, applied to the first electrode. FIG. 3A illustrates a cross sectional view of the inventive M×N electrostrictive actuated mirror array 300.

Figure 3B:
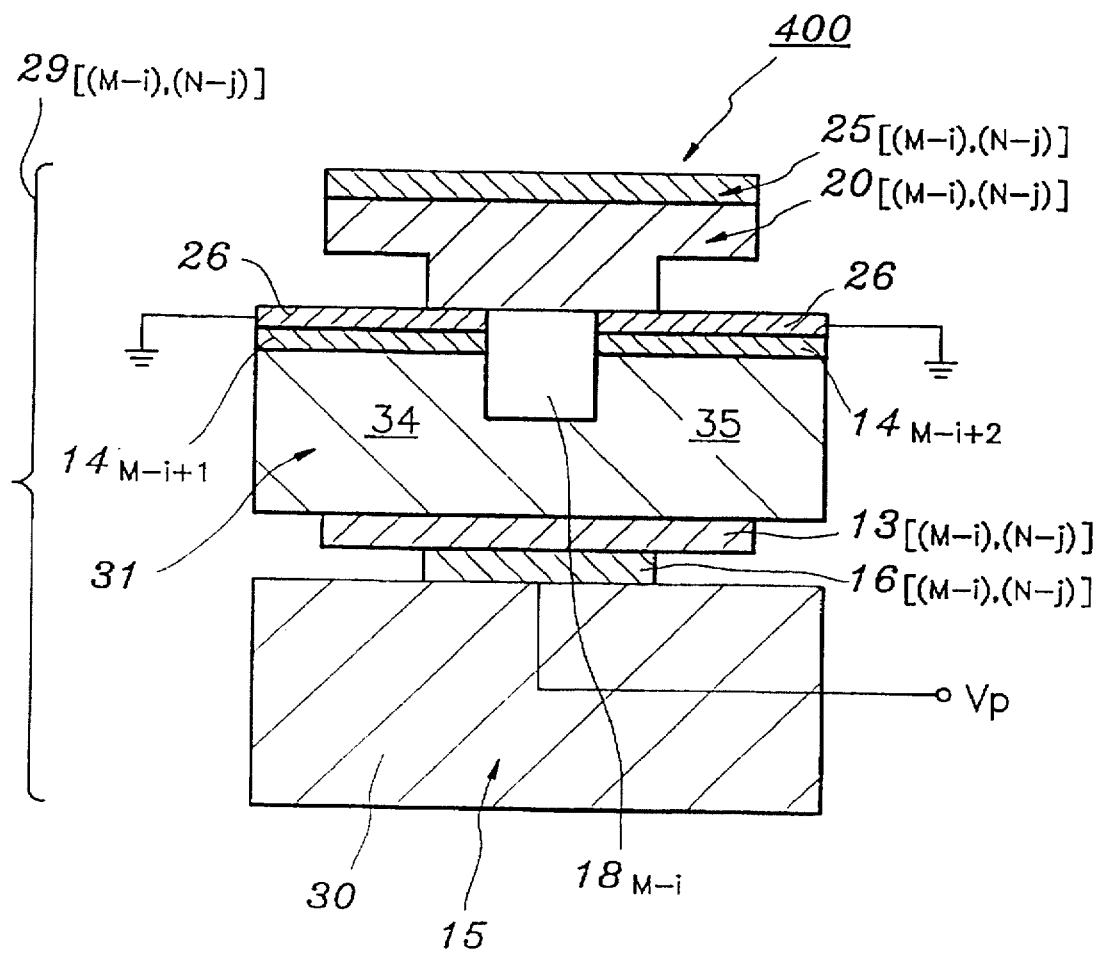

If the electrodisplacive member 31 is made of a piezoelectric material, e.g., PZT, the pair of second electrodes in each actuator function as the common reference electrodes and hence are connected to ground. The first electrode function as the common signal electrode, the voltage, $V_p$, applied thereto being developed in accordance with a corresponding pixel intensity. In such an actuator, since the piezoelectric material located in the actuating members is polarized in the opposite direction, the amount of mechanical deformation the actuator will undergo, and, hence the degree of mirror tilting, will depend on the degree of poling and the signal voltage, $V_p$. FIG. 3B depicts a cross sectional view of the inventive M×N piezoelectric actuated mirror array 400, wherein the arrows indicate the polarization directions of the piezoelectric material in the actuator.

While the present invention has been described with respect to certain preferred embodiments only, other modifications and variations may be made without departing from the scope of the present invention as set forth in the following claims.

What is claimed is:

1. A method for manufacturing an array of M×N electrodisplacive actuated mirrors for use in an optical projection system, wherein M and N are integers, the method comprising the steps of:

(a) preparing a ceramic wafer, made of an electrodisplacive material, having a top and a bottom surfaces;

(b) forming an array of M×N regularly spaced, identically sized first electrodes an the bottom surface of said ceramic wafer and an array of M+1 regularly spaced, identically sized second electrodes on the top surface thereof, wherein each of the M+1 second electrodes extends across the top surface and each of the M×N first electrodes overlaps portions of two adjacent second electrodes and the centerline between two adjacent second electrodes coincides with the centerline of the first electrodes overlapping thereof;

(c) mounting said ceramic wafer treated in accordance with said step (b) on an active matrix, including a substrate, an array of M×N transistors and an array of M×N connecting terminals to thereby connect each of the first electrodes with each of the M×N connecting terminals;

(d) covering each of the M+1 second electrodes with an insulating layer;

(e) providing a photoresistive necked segment on top of each of the M+1 insulating layers covering the M+1 second electrodes;

(f) forming a set of M trenches, wherein each of the M trenches is located between two second electrodes and on the centerline of the first electrodes, runs parallel to the second electrodes, and is provided with a set of N−1 grooves, running perpendicular thereto;

(g) removing the photoresistive necked segments;

(h) placing an array of M×N hinges on the top surface of said ceramic wafer treated in accordance with said steps (b), (c), (d), (e), (f) and (g), wherein each of the M×N hinges is provided with a top surface and a bottom surface provided with a protrusion mounted simultaneously on the insulating layers covering two adjacent second electrodes;

(i) providing a water soluble separator on the exposed region on the top surface of said ceramic wafer treated in accordance with said steps (b) to (h), not covered by the M×N hinges;

(j) forming a mirror on the top surface of each of the M×N hinges; and (k) removing the water soluble separator to thereby form an array of M×N electrodisplacive actuated mirrors.

2. The method of claim 1, wherein the M×N first electrodes and the M+1 second electrodes are formed by first sputtering the top and bottom surfaces of said ceramic wafer with a conductive metallization, and then patterning the top and bottom surfaces into the array of M+1 second electrodes and the array of M×N first electrodes, respectively, by using a photolithography method.

3. The method of claim 1, wherein said ceramic wafer is made of a piezoelectric material.

4. The method of claim 3, after the M×N first electrodes and the M+1 second electrodes have been formed.

5. The method of claim 4, wherein said ceramic wafer is poled by applying D.C. voltage to every other second electrodes and the first electrodes, the first electrodes being connected to ground; and then by applying the same D.C. voltage to the remaining second electrodes and the first electrodes, the remaining second electrodes being connected to ground.

6. The method of claim 5, wherein the DC voltage applied to said ceramic wafer ranges from 30 V to 60 V.

7. The method of claim 1, wherein the set of M trenches and the set of N−1 grooves formed on each trench are obtained using an etching method.

8. The method of claim 1, wherein the mirror is formed on the top surface of each of the M×N hinges by sputtering a light reflecting material thereon.

* * * * *